US012025685B2

United States Patent
Goto et al.

(10) Patent No.: US 12,025,685 B2
(45) Date of Patent: Jul. 2, 2024

(54) MAGNETIC RESONANCE IMAGING APPARATUS

(71) Applicant: FUJIFILM Healthcare Corporation, Kashiwa (JP)

(72) Inventors: Kengo Goto, Tokyo (JP); Manabu Aoki, Tokyo (JP); Taisuke Takayanagi, Tokyo (JP); Shin Hoshino, Kashiwa (JP); Yukinobu Imamura, Kashiwa (JP); Hiroyuki Takeuchi, Kashiwa (JP); Takeshi Nakayama, Kashiwa (JP)

(73) Assignee: FUJIFILM Healthcare Corporation, Chiba (JP)

( * ) Notice: Subject to any disclaimer, the term of this patent is extended or adjusted under 35 U.S.C. 154(b) by 235 days.

(21) Appl. No.: 17/840,252

(22) Filed: Jun. 14, 2022

(65) Prior Publication Data

US 2022/0413071 A1   Dec. 29, 2022

(30) Foreign Application Priority Data

Jun. 29, 2021   (JP) ................................. 2021-107450

(51) Int. Cl.
*H01F 6/00*   (2006.01)
*G01R 33/38*   (2006.01)
*G01R 33/421*   (2006.01)

(52) U.S. Cl.
CPC ..... *G01R 33/4215* (2013.01); *G01R 33/3802* (2013.01); *H01F 6/00* (2013.01)

(58) Field of Classification Search
CPC .................................................. H01F 6/00–06

(Continued)

(56) References Cited

U.S. PATENT DOCUMENTS 5,631,616 A * 5/1997 Ohta ..................... H01F 7/0278
   335/297
5,680,086 A * 10/1997 Allis .................. G01R 33/3873
   324/318

(Continued)

FOREIGN PATENT DOCUMENTS

| JP | 05-182821 | 7/1993 |
| JP | 2004-065714 | 3/2004 |
| JP | 2016-096829 | 5/2016 |

*Primary Examiner* — Alexander Talpalatski
(74) *Attorney, Agent, or Firm* — Paul Teng

(57) ABSTRACT

An MRI apparatus equipped with a magnetic shield structure to reduce flux leakage. The MRI apparatus includes: a pair of static magnetic magnets that are disposed on opposite sides of an imaging space; and a pair of gradient coils that are disposed on opposite sides of the imaging space. Each static magnetic magnet has a disk-shaped magnetic material pole 201 and a ring-shaped magnetic material pole 202. Each gradient coil has a first coil 204 that applies a magnetic field gradient in a Z axis direction in an imaging region, and a laminate 301 that shields the disk-shaped magnetic material pole from magnetic flux produced in the first coil. The laminate has a smaller thickness in the Z axis direction on the ring-shaped magnetic material pole side than that in a center portion of the imaging space. A vertical lowest portion of a laminate end portion on the ring-shaped magnetic material pole side of the laminate is in a higher position than a position of a lowest portion of a laminate central portion on the imaging region side of the laminate.

9 Claims, 7 Drawing Sheets

(58) Field of Classification Search
USPC .......................................................... 335/216
See application file for complete search history.

(56) References Cited

U.S. PATENT DOCUMENTS

| | | | | |
|---|---|---|---|---|
| 6,794,973 B1* | 9/2004 | Aoki | ................... | G01R 33/383 |
| | | | | 335/216 |
| 9,536,649 B2* | 1/2017 | Tsuda | ........................ | H01F 6/02 |
| 2009/0072939 A1* | 3/2009 | Shen | .................... | G01R 33/383 |
| | | | | 335/306 |
| 2010/0219833 A1* | 9/2010 | McGinley | ............ | G01R 33/383 |
| | | | | 324/318 |

* cited by examiner

MAGNETIC RESONANCE IMAGING APPARATUS

CLAIM OF PRIORITY

The present application claims priority from Japanese patent application JP 2021-107450 filed on Jun. 29, 2021, the content of which is hereby incorporated by reference into this application.

BACKGROUND OF THE INVENTION

The present invention relates to a magnetic shield structure to reduce leakage of magnetic flux produced by a gradient coil in a magnetic resonance imaging (hereinafter referred to as "MRI") apparatus.

The MRI apparatus is an apparatus that applies a high frequency magnetic field to a subject under examination to cause hydrogen atoms within the human body to resonate, uses a receiver coil to acquire radio waves produced at the resonation, and extracts the acquired radio waves as an image. The MRI apparatus is mainly made up of a static magnetic magnet for producing a uniform static magnetic field, a gradient coil that produces a spatially linear magnetic field and adds positional information to a signal obtained from MRI, and the abovementioned receiver coil for receiving radio waves coming from hydrogen atoms, and the like.

The gradient coil conducts a pulse current waveform to generate a desired spatial magnetic field, so that a variable magnetic field is caused by eddy currents in accordance with the current changes, which in turn causes eddy currents to occur in metallic parts within the MRI apparatus. The variable magnetic field gives rise to deterioration in the uniformity of the static magnetic field and/or affects a spatial distribution of a gradient magnetic field, and therefore becomes a factor that contributes to image deterioration. Particularly, a magnet for producing a static magnetic field often has magnetic poles of iron material, and can exert influences on magnetization of the magnetic pole material.

To address this, for inhibiting the image deterioration, recent MRI apparatus is provided with an additional function such as compensating for a reversed magnetic field in which an eddy current occurs, which is called an active shield coil.

However, due to a region occupied by the active shield, the distance between the magnet and an imaging space is increased to increase the magnetic reluctance. This increases the magnetomotive force for generating a required static magnetic field and the size of the magnetic pole. An increase in magnetomotive force may be adjusted by a coil current and/or the number of turns, but this can result in an increase in magnetic energy due to the increased coil current and/or an increase in costs due to the increased size of the coil and/or magnetic pole.

Against such background, for example, Japanese Unexamined Patent Application Publication No. Hei 5-182821 discloses a countermeasure method for a medium-low magnetic field MRI apparatus, in which a magnetic material pole piece such as soft ferrite and a silicon steel sheet is placed between a gradient coil and a metallic structure, the magnetic material pole piece providing a passage of magnetic flux and being capable of inhibiting the occurrence of eddy current.

Further, in Japanese Unexamined Patent Application Publication No. 2004-65714, a configuration is known that includes a laminate that is divided into a surface layer portion and a deep layer portion which are placed between the gradient coil and a magnetic material pole in order to reduce the eddy current, the surface layer portion being made up of silicon steel sheets with a smaller diameter, the deep layer portion being made up of silicon steel sheets with a larger diameter. With the configuration, a reduction in apparent magnetic permeability is prevented by virtue of reduced eddy current and reduced diameter of the silicon steel sheets.

Further, in Japanese Unexamined Patent Application Publication No. 2016-96829, the configuration with improved time constant of attenuation is achieved by adopting the slit structure for the magnetic poles in order to reduce the region through which the eddy current is conducted. This reduces leakage of magnetic flux to the magnetic poles when the current in the gradient coil varies with time.

However, for example, in Japanese Unexamined Patent Application Publication No. Hei 5-182821, the use of soft ferrite with a low saturation magnetization gives rise to a loss of magnetic shielding effect under high magnetic field, e.g., under a 1.5 T static magnetic field, which thus makes a reduction in eddy current difficult. In the configuration described in Japanese Unexamined Patent Application Publication No. 2004-65714, a plurality of laminates with different sizes is required to be prepared. This can lead to increased manufacturing cost for the laminates and prolonged manufacturing time. Further, in the configuration described in Japanese Unexamined Patent Application Publication No. 2016-96829, because of the slit made in the magnetic pole, an additional reinforcing member can be required to prevent degradation in structural strength of the magnetic pole. Further, the amount of iron material is decreased by the slit to reduce the apparent magnetic permeability. Therefore, the required magnetomotive force is increased, which thus can result in a cost increase.

SUMMARY OF THE INVENTION

It is an object of the present invention to address the above problems and it is another object of the present invention to provide an MRI apparatus equipped with a magnetic shield structure to reduce flux leakage.

To achieve the objects, an aspect of the present invention provides a magnetic resonance imaging apparatus that includes: a pair of static magnetic magnets that are disposed on opposite sides of an imaging space; and a pair of gradient coils that are disposed on opposite sides of the imaging space. Each of the pair of static magnetic magnets has a disk-shaped magnetic material pole and a ring-shaped magnetic material pole. Each of the pair of gradient coils has: a first coil that applies a magnetic field gradient in a Z axis direction in an imaging region;

and a laminate that shields the disk-shaped magnetic material pole from magnetic flux produced in the first coil. The laminate has a smaller thickness in the z axis direction on the ring-shaped magnetic material pole side than that in a center portion of the imaging space, and a vertical lowest portion of a laminate end portion on the ring-shaped magnetic material pole side of the laminate is in a higher position than a position of a lowest portion of a laminate central portion on the imaging region side of the laminate.

To achieve the above objects, another aspect of the present invention provides a magnetic resonance imaging apparatus that includes: a pair of static magnetic magnets that are disposed on opposite sides of an imaging space; and a pair of gradient coils that are disposed on opposite sides of the imaging space. Each of the pair of static magnetic magnets has a disk-shaped magnetic material pole and a ring-shaped magnetic material pole. Each of the pair of gradient coils has: a first coil that applies a magnetic field gradient in a Z axis direction in an imaging region; and a laminate that shields the disk-shaped magnetic material pole from magnetic flux produced in the first coil. The laminate has a greater thickness in the Z axis direction on the ring-shaped magnetic material pole side than that in a center portion of the imaging space, and a vertical lowest portion of a laminate end portion on the ring-shaped magnetic material pole side of the laminate is disposed in a lower position than a position of a lowest portion of a laminate central portion.

According to the present invention, the MRI apparatus is provided to enable a reduction in leakage to the magnetic pole of the static magnetic magnet to prevent the deterioration of image quality without a positional change to change the diameter of the laminate, and a reduction in eddy current without an increase in manufacturing costs for the laminate.

DETAILED DESCRIPTION OF THE PREFERRED EMBODIMENTS

Various examples of embodiments according to the present invention will now be described with reference to the accompanying drawings. Throughout the drawings, like reference signs indicate like components/portions.

Example 1

Figure 1:
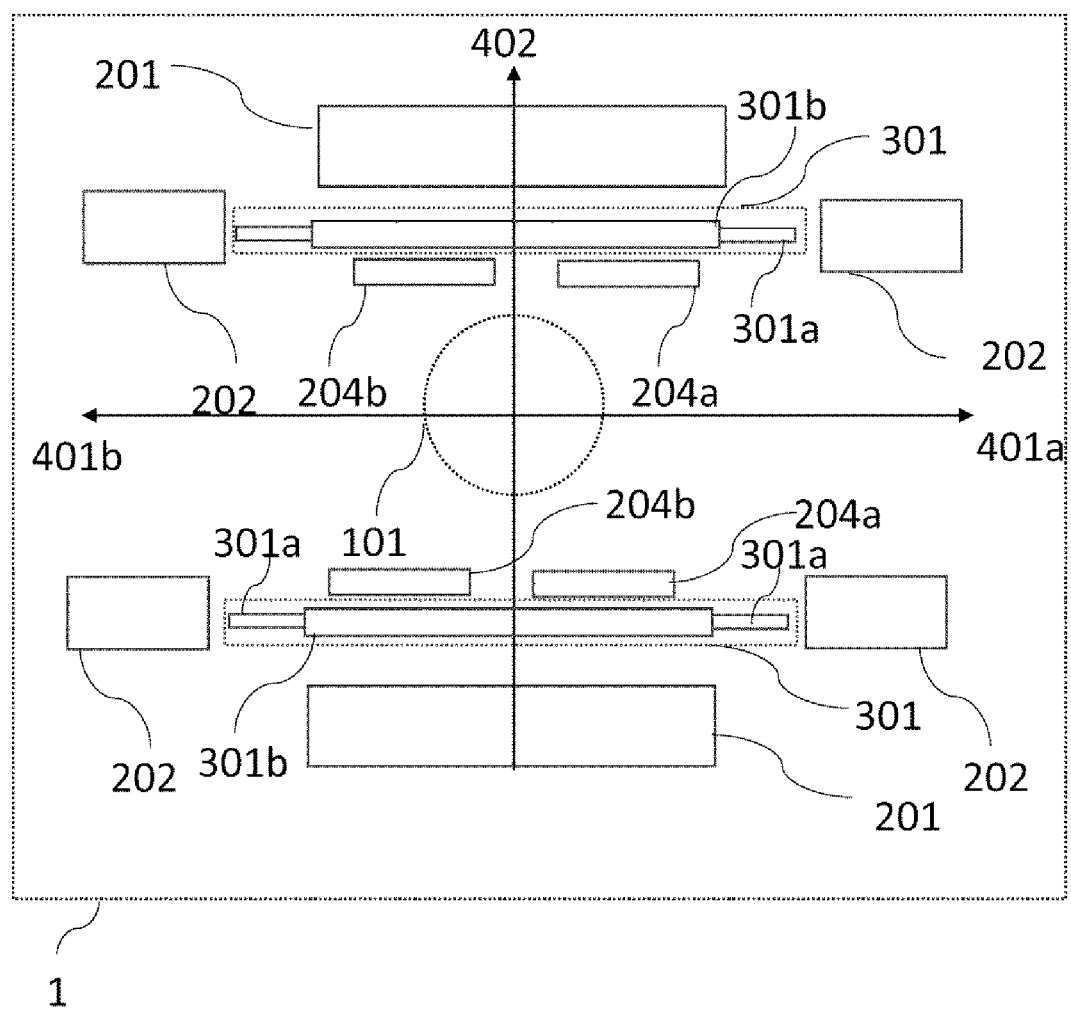
FIG. 1 is diagram illustrating an example configuration of an open MRI apparatus including a laminate according to Example 1.

Example 1 is an example of an MRI apparatus configured to include: a pair of static magnetic magnets that are disposed on opposite sides of an imaging space; and a pair of gradient coils that are disposed on opposite sides of the imaging space, in which each static magnetic magnet has a disk-shaped magnetic material pole and a ring-shaped magnetic material pole, and each gradient coil has: a first coil that applies a magnetic field gradient in a Z axis direction in an imaging region; and a laminate that shields the disk-shaped magnetic material pole from magnetic flux produced in the first coil. The laminate has a smaller thickness in the Z axis direction on the ring-shaped magnetic material pole side than that in a center portion of the imaging space, and a vertical lowest portion of a laminate end portion on the ring-shaped magnetic material pole side of the laminate is in a higher position than a position of a lowest portion of a laminate central portion on the imaging region side of the laminate. FIG. 1 illustrates an open MRI apparatus according to Example 1 in a schematic form. In the MRI apparatus 1, static magnetic strength is generated by the pair of static magnetic magnets made up of the disk-shaped magnetic material poles 201 and the ring-shaped magnetic material poles 202, and the ring-shaped coil using superconductive material and/or the like, all of which are disposed around the imaging space 101. Further, a shield coil is included to generate the reversed magnetic field from the ring-shaped coil for the purpose of reducing the magnetic field outside the imaging region.

Where the ring-shaped coil for creating a static magnetic field is superconductive material, the coil in question is housed in a vacuum vessel for placing the coil in a vacuum, in a radiation shield, or in a vessel of liquid helium and/or the like, in order to be maintained at ultralow temperatures. A gradient coil 204 which corresponds to the first coils on opposite sides of the imaging space outputs a pulse waveform that causes the field strength within the space to vary depending on the distance from the imaging center.

Figure 2:
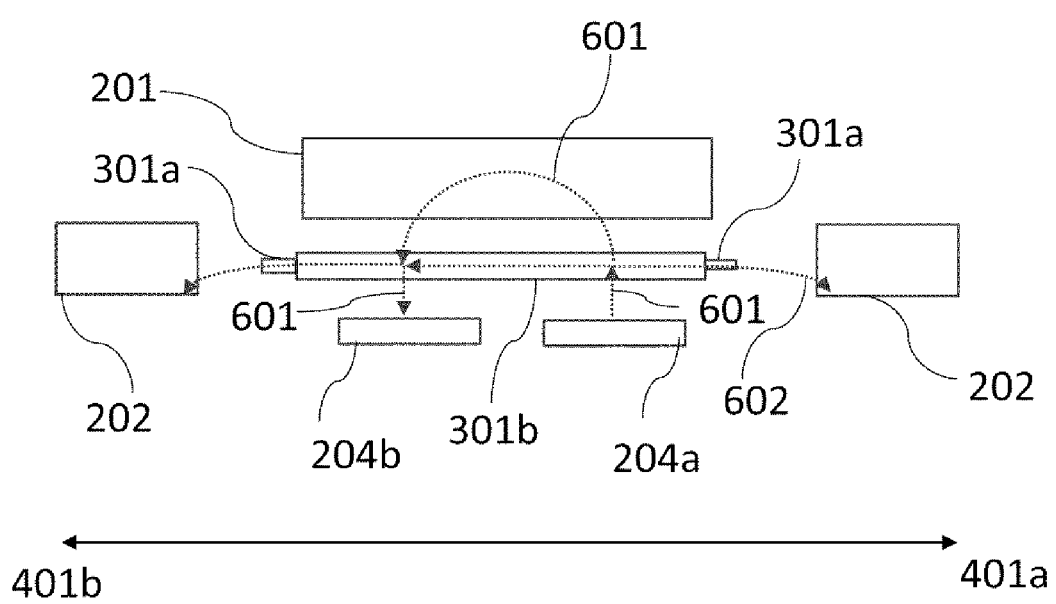
FIG. 2 is a diagram illustrating the flow of magnetic flux produced by a gradient coil, a magnetic material pole, and the laminate having laminate end portions disposed in a central portion of a laminate central portion along a Z axis, according to Example 1.

FIG. 2 is a conceptual diagram illustrating paths of magnetic flux 601 created by the gradient coil 204 and flowing through or into a laminate 301, the disk-shaped magnetic material pole 201, and the ring-shaped magnetic material pole 202. The gradient coil 204 includes a coil 204a that produces a magnetic field in the positive direction of a Z axis 402 and a coil 204b that produces a vertically downward magnetic field in the negative direction of the Z axis 402, in which the magnetic paths are created through the laminate and the static magnetic magnet. The gradient coil 204 is disposed within the diameter of the disk-shaped magnetic material pole 201.

The magnetic flux 601 created by the gradient coil 204 tends to flow through material with high magnetic permeability such as iron material and magnetic reluctance with short path, but the magnetic flux 602 flows through a magnetic path via air with high magnetic reluctance, for example, through air from the laminate 301 into the ring-shaped magnetic material pole 202, so that eddy current can flow into the magnetic pole. Particularly, on the imaging region side of the laminate 301 (the negative direction of the Z axis 402 in FIG. 1), the distance to the gradient coil 204 is physically shorter and the magnetic reluctance is low. Therefore, the field leakage into the ring-shaped magnetic material pole 202 via the low magnetic reluctance is increased. For inhibiting the increase of field leakage into the ring-shaped magnetic material pole 202, the length of the laminate 301 along the R axis (radial direction) 401 is shortened to increase the physical distance between the ring-shaped magnetic material pole and the laminate, and thus the magnetic reluctance is increased. However, as the amount of magnetic flux flowing into the disk-shaped magnetic material pole 201 from the gradient coil 204 is increased, the amount of eddy current is increased.

On the other hand, on the laminate in the positive direction of the Z axis 402, the distance to the gradient coil 204 is longer and the magnetic reluctance is high. Therefore, as compared with the abovementioned arrangement in the negative direction of the Z axis 402, the field leakage to the ring-shaped magnetic material pole is reduced. Therefore, a laminate end portion 301a is disposed in the middle in the Z axis 402 direction of a laminate central portion 301b which is the silicon steel sheets, thus the flux leakage to the ring-shaped magnetic material pole is reduced. In other words, end portions of the laminate are placed in the middle in the Z axis direction of a central portion of the laminate.

Figure 3:
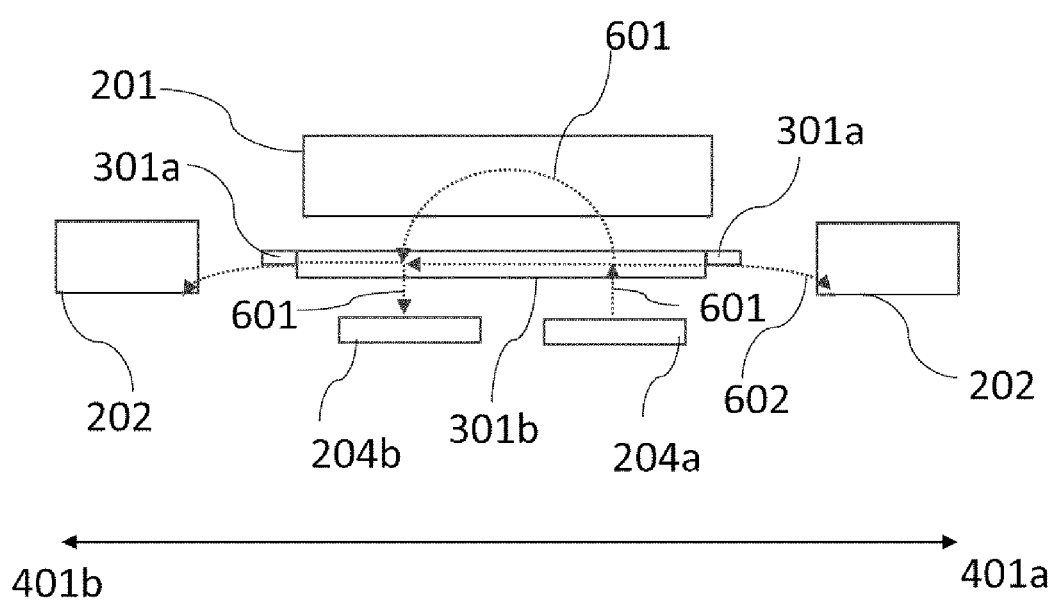
FIG. 3 is a diagram illustrating the flow of magnetic flux produced by the gradient coil, the magnetic material pole, and the laminate having laminate end portions disposed on an upper side of a laminate central portion along a Z axis, according to Example 1.

In FIG. 2, the laminate end portions 301a are placed in the middle in the Z axis 402 direction on the laminate central portion 301b. As illustrated in FIG. 3, however, the laminate end portions 301a may be placed in the positive direction of the Z axis 402. Further, the flow of magnetic flux illustrated in FIG. 2 is illustrated as being produced by gradient coils called XGC and YGC which produce gradient fields with respect to the X axis and the Y axis in the radial directions, which is different from a flow of magnetic flux by a gradient coil ZGC which produces a gradient field with respect to the Z axis direction.

Figure 4:
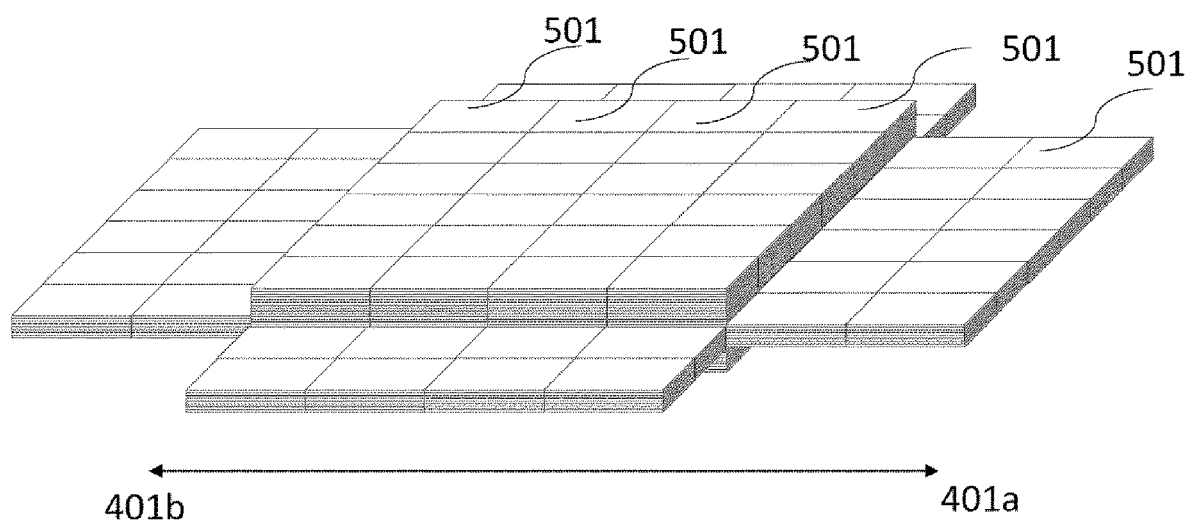
FIG. 4 is a diagram illustrating an example configuration of the laminate according to Example 1.

FIG. 4 illustrates a schematic diagram of the laminate 301 according to Example 1, in which the laminate consists of a plurality of thin film materials 501 stacked together. For the thin film material 501, for example, an electromagnetic steel sheet having very excellent electrical and magnetic properties is used. For the thin film material, any other material with high electrical resistance and high magnetic permeability such as the electromagnetic steel sheet may be used.

Under high magnetic field, e.g., under a 1.5 T static magnetic field, the laminate central portion 301b may have any thickness depending of the required performance of the MRI apparatus, but the laminate central portion 301b preferably has a thickness of at least 20 mm or greater if a silicon steel sheet is used as described above and consideration is given to shielding of magnetic flux reaching the disk-shaped magnetic material pole 201. The laminate end portion 301a which is an insulator block preferably has a thickness of at least 10 mm or greater. Further, the thin film material 501 preferably has a size of 100 mm by 100 mm or less. That is, preferably, the laminate has a thickness of 20 mm or greater and is formed by staking the thin film materials with a diameter of 100 mm or less on top of another, in which it is recommendable that all the thin film materials should be approximately equal in terms of shape to each other.

Figure 5:
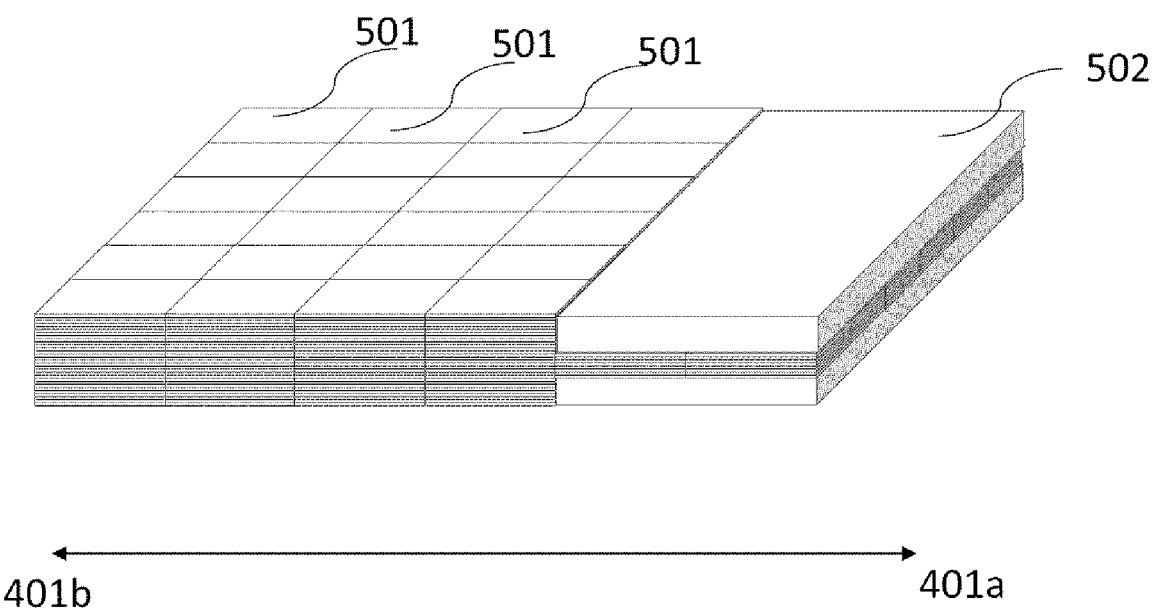
FIG. 5 is a diagram illustrating an example configuration of an insulator and the laminate according to Example 1.

FIG. 5 illustrates a configuration for maintaining the uniformity of thickness of the laminate 301 shown in FIG. 4. In the laminate in Example 1, an electromagnetic force may be produced, and at worst, a misalignment and/or the like can occur in the laminate structure to lead to equipment failure. Therefore, the laminate is secured with a fixing member which preferably holds integrally a component made up of the laminate 301 and an insulator 502.

Further, where the radial length of the laminate central portion 301b described in Example 1 is located on the imaging region side of the gradient coil 204, the magnetic flux produced by the gradient coil can leak directly to the disk-shaped magnetic material pole. To address this, the radial length of the laminate is preferably longer than the position of the gradient coil 204. That is, the laminate preferably has a smaller thickness in the Z axis direction on the ring-shaped magnetic material pole side than that in a center portion of the imaging space, and a vertical lowest portion of the laminate end portion on the ring-shaped magnetic material pole side of the laminate is preferably in a higher position than the position of a lowest portion of the laminate central portion on the imaging region side of the laminate.

Example 2

Example 2 is an example of an MRI apparatus that is configured to include: a pair of static magnetic magnets which are disposed on opposite sides of an imaging space; and a pair of gradient coils which are disposed on opposite sides of the imaging space, in which each of the pair of static magnetic magnets has a disk-shaped magnetic material pole and a ring-shaped magnetic material pole, and the gradient coil has: a first coil that applies a magnetic field gradient in a Z direction in an imaging region; and a laminate that shields the disk-shaped magnetic material pole from magnetic flux produced in the first coil. The laminate has a greater thickness in the Z axis direction on the ring-shaped magnetic material pole side than that in a center portion of the imaging space, and a vertical lowest portion of a laminate end portion on the ring-shaped magnetic material pole side of the laminate is disposed in a lower position than that of a lowest portion of a laminate central portion.

Figure 6:
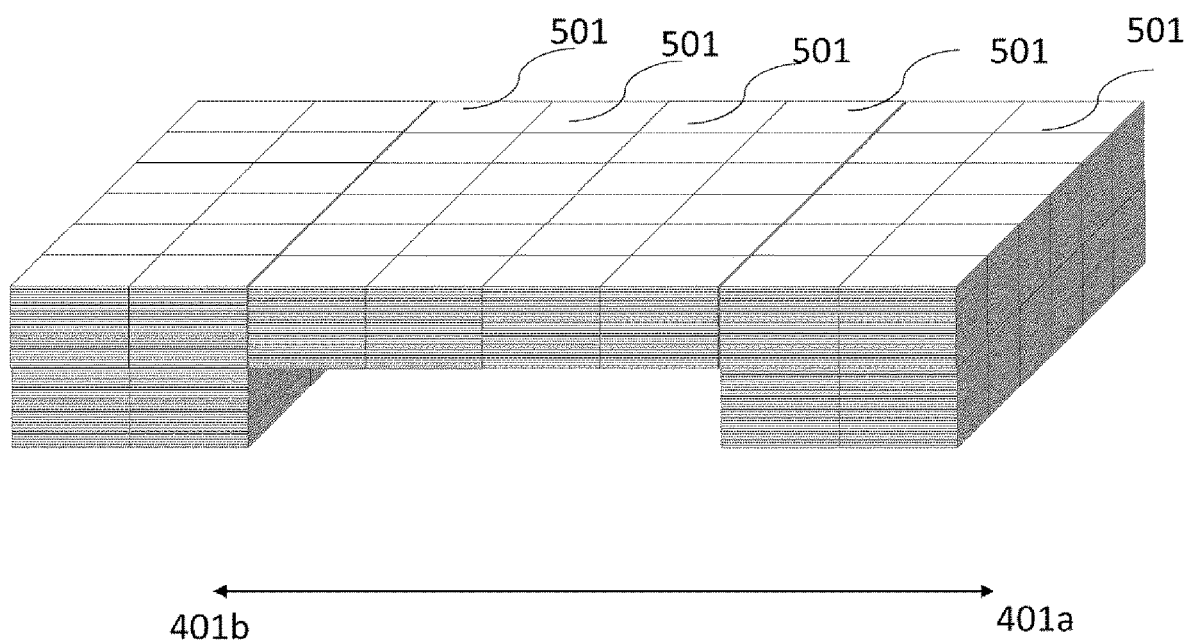
FIG. 6 is a diagram illustrating another example configuration of an insulator and a laminate according to Example 2.
Figure 7:
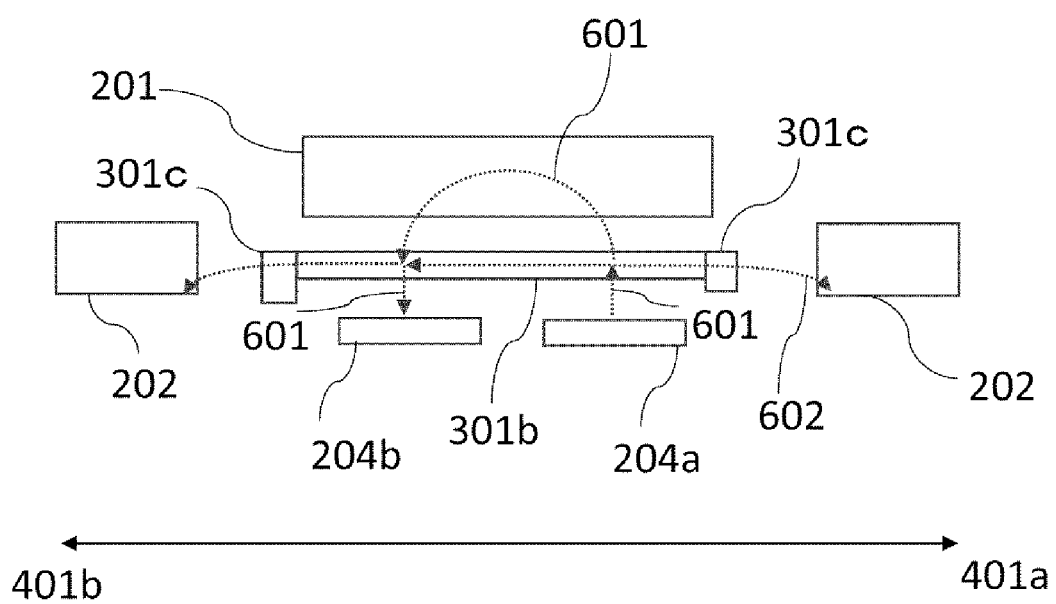
FIG. 7 is a diagram illustrating an example configuration of an MRI apparatus including the laminate according to Example 2.

In Example 1, the laminate end portion 301a partially forming the laminate 301 is described as having a greater thickness than that of the laminate central portion 301b. As illustrated in FIG. 6 and FIG. 7, however, if each of laminate end portions 301c is thicker than the laminate central portion 301b and the lowest portion of the laminate end portion 301c is in a lower position than the lowest portion of the laminate central portion 301b, the flux leakage to the ring-shaped magnetic material pole may be allowed to escape in the vertically downward direction. As a result, a reduction in eddy current may be achieved to inhibit the deterioration of image quality.

In Example 2, the laminate also has a thickness of 20 mm or greater and is formed by staking the thin film materials with a diameter of 100 mm or less on top of another, in which it is recommendable that all the thin film materials may be approximately equal in terms of shape to each other. Further, it is recommendable that the gradient coil is disposed within the diameter of the static magnetic magnet.

It is to be understood that the present invention is not limited to the above examples and is intended to embrace various modifications. For example, the above examples have been described in detail for the purpose of providing a better understanding of the present invention, and the present invention is not necessarily limited to including all the components and configurations described above. It is also to be understood that a portion of the configuration of one example may be substituted for a configuration of another example, and a configuration of one example may be added to a configuration of another example.

REFERENCE SIGNS LIST

1 . . . open MRI apparatus
101 . . . imaging space
201 . . . disk-shaped magnetic material pole
202 . . . ring-shaped magnetic material pole
204 . . . gradient coil
301 . . . laminate
301a . . . laminate end portion
301b . . . laminate central portion
301c . . . laminate end portion having a greater thickness than that of the laminate central portion 301b
401, 401a, 401b . . . radial direction
402 . . . height direction
501 . . . thin film material
502 . . . insulator material
601 . . . magnetic flux
602 . . . magnetic flux

What is claimed is:

1. A magnetic resonance imaging apparatus, comprising:
a pair of static magnetic magnets that are disposed on opposite sides of an imaging space; and
a pair of gradient coils that are disposed on opposite sides of the imaging space,
wherein each of the pair of static magnetic magnets has a disk-shaped magnetic material pole and a ring-shaped magnetic material pole,
each of the pair of gradient coils has
a first coil that applies a magnetic field gradient in a Z axis direction in an imaging region, and
a laminate that shields the disk-shaped magnetic material pole from magnetic flux produced in the first coil, and
the laminate has a smaller thickness in the Z axis direction on the ring-shaped magnetic material pole side than that in a center portion of the imaging space, and a vertical lowest portion of a laminate end portion on the ring-shaped magnetic material pole side of the laminate is in a higher position than a position of a lowest portion of a laminate central portion on the imaging region side of the laminate.

2. The magnetic resonance imaging apparatus according to claim 1, wherein the laminate has a thickness of 20 mm or greater.

3. The magnetic resonance imaging apparatus according to claim 2, wherein the laminate is formed by stacking thin film materials having a diameter of 100 mm or less on top of another, and all the thin film materials are approximately equal in terms of shape to each other.

4. The magnetic resonance imaging apparatus according to claim 1, wherein the gradient coil is disposed within a diameter of the static magnetic magnet.

5. The magnetic resonance imaging apparatus according to claim 1, wherein the laminate end portion is placed in a middle in the Z axis direction of the laminate central portion.

6. A magnetic resonance imaging apparatus, comprising:
a pair of static magnetic magnets that are disposed on opposite sides of an imaging space; and
a pair of gradient coils that are disposed on opposite sides of the imaging space,
wherein each of the pair of static magnetic magnets has a disk-shaped magnetic material pole and a ring-shaped magnetic material pole,
each of the pair of gradient coils has
a first coil that applies a magnetic field gradient in a Z axis direction in an imaging region, and
a laminate that shields the disk-shaped magnetic material pole from magnetic flux produced in the first coil, and
the laminate has a greater thickness in the Z axis direction on the ring-shaped magnetic material pole side than that in a center portion of the imaging space, and a vertical lowest portion of a laminate end portion on the ring-shaped magnetic material pole side of the laminate is disposed in a lower position than a position of a lowest portion of a laminate central portion.

7. The magnetic resonance imaging apparatus according to claim 6, wherein the laminate has a thickness of 20 mm or greater.

8. The magnetic resonance imaging apparatus according to claim 7, wherein the laminate is formed by stacking thin film materials having a diameter of 100 mm or less on top of another, and all the thin film materials are approximately equal in terms of shape to each other.

9. The magnetic resonance imaging apparatus according to claim 6, wherein the gradient coil is disposed within a diameter of the static magnetic magnet.

* * * * *